US008115483B2

(12) United States Patent
Biber

(10) Patent No.: US 8,115,483 B2
(45) Date of Patent: Feb. 14, 2012

(54) METHOD AND DEVICE FOR FIELD QUALITY TESTING OF A MAGNETIC RESONANCE ANTENNA

(75) Inventor: Stephan Biber, Erlangen/Frauenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 204 days.

(21) Appl. No.: 12/472,538

(22) Filed: May 27, 2009

(65) Prior Publication Data
US 2009/0302845 A1 Dec. 10, 2009

(30) Foreign Application Priority Data

Jun. 5, 2008 (DE) .................. 10 2008 026 849

(51) Int. Cl.
*G01V 3/00* (2006.01)
(52) U.S. Cl. ........................................ 324/309
(58) Field of Classification Search .......... 324/300–322; 600/410–435
See application file for complete search history.

(56) References Cited

U.S. PATENT DOCUMENTS

| 6,005,891 | A | 12/1999 | Chadwick et al. |
| 6,771,057 | B1 | 8/2004 | Raddant |
| 6,965,232 | B2 * | 11/2005 | Sodickson .................. 324/307 |
| 7,474,976 | B2 | 1/2009 | Schenkel et al. |
| 2002/0016696 | A1 * | 2/2002 | Rabe ............................ 702/183 |
| 2006/0038562 | A1 | 2/2006 | Pittaluga et al. |
| 2006/0082494 | A1 | 4/2006 | Deininger et al. |

FOREIGN PATENT DOCUMENTS

DE   299 11 541   10/1999

OTHER PUBLICATIONS

"Experimental Analysis of Parallel Excitation Using Dedicated Coil Setups and Simultaneous RF Transmission on Multiple Channels," Ullmann et al, Magnetic Resonance in Medicine, vol. 54 (2005), pp. 994-1001.

* cited by examiner

*Primary Examiner* — Dixomara Vargas
(74) *Attorney, Agent, or Firm* — Schiff Hardin LLP

(57) ABSTRACT

In a method and device for field quality testing of a magnetic resonance antenna arrangement of a magnetic resonance system composed of multiple antenna elements, a test signal is fed into the respective antenna elements by a transmission antenna and the test signal, or a noise signal that occurs with no signal fed to the respective antenna elements, is determined at a receiver unit for each of at least some of the individual antenna elements. The noise received noise signals and/or test signals are analyzed with regard to specific characteristic data and a quality state of the magnetic resonance antenna arrangement is determined based thereon.

23 Claims, 5 Drawing Sheets

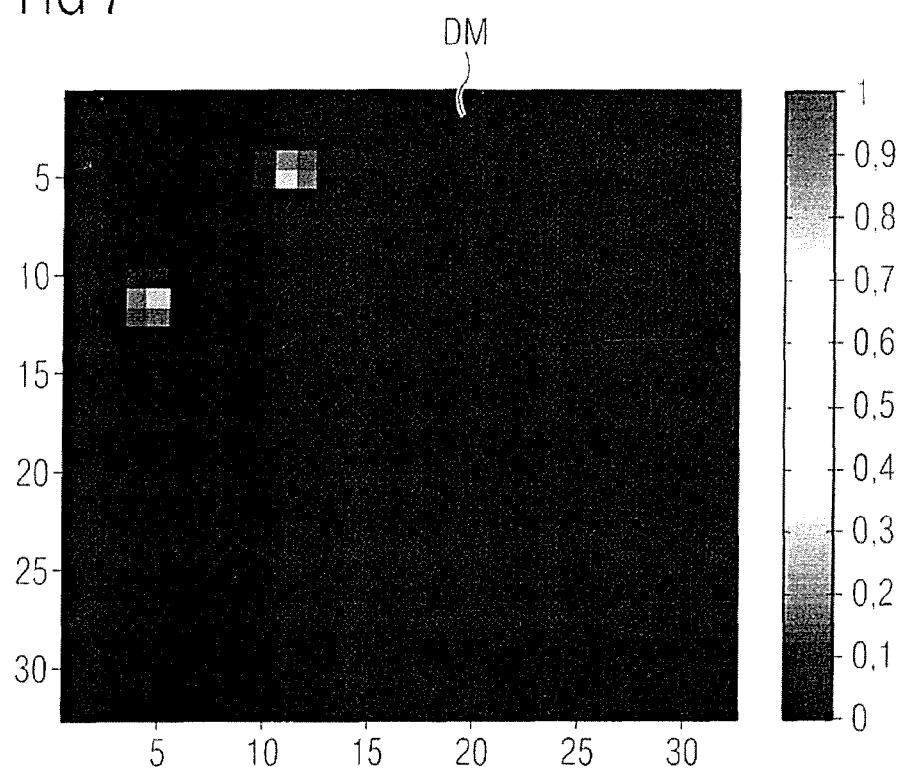

METHOD AND DEVICE FOR FIELD QUALITY TESTING OF A MAGNETIC RESONANCE ANTENNA

BACKGROUND OF THE INVENTION

1. Field of the Invention

The present invention concerns a method and a testing device for field quality testing of a magnetic resonance antenna arrangement of a magnetic resonance system, the magnetic resonance antenna arrangement being formed of multiple antenna elements. As used herein, "field quality testing" means testing a quality testing (in particular error checking) of the magnetic resonance antenna arrangement on location at the operating (installation) site, in particular in a situation located in the magnetic resonance measurement (data acquisition) chamber of the magnetic resonance system. Moreover, the invention concerns a magnetic resonance system with such a testing device and a magnetic resonance antenna arrangement.

2. Description of the Prior Art

Magnetic resonance tomography is a widespread method for acquisition of images of the inside of a body. In this method the body to be examined is exposed to a relatively high basic magnetic field, for example of 1.5 Tesla or even of 3 Tesla in newer systems (known as high magnetic field systems). A radio-frequency excitation signal (known as the $B_1$ field) is then emitted, which causes the nuclear spins of specific atoms excited to resonance by this radio-frequency field to be tilted by a specific flip angle relative to the magnetic field lines of the basic magnetic field. The radio-frequency signal (known as the magnetic resonance signal) radiated upon relaxation (return to equilibrium) of the nuclear spins is then acquired with suitable antenna arrangements (called "magnetic resonance antenna arrangements" in the following). The raw data acquired in this manner are ultimately used to reconstruct the desired image data. Respective defined magnetic field gradients are superimposed on the basic magnetic field for spatial coding during the transmission and the readout (acquisition) of the radio-frequency signals.

The magnetic resonance antenna arrangement for acquisition of the magnetic resonance signals can be the same antenna arrangement that is used to emit the $B_1$ field. Normally a so-called "whole-body coil" (also called "whole-body antenna" or "body coil") is installed in the scanner unit to emit the $B_1$ field in the scanner unit in which the magnetic resonance measurement chamber is located (usually in the form of a patient tunnel extending through the scanner unit). It is fashioned to emit a homogenous $B_1$ field in an optimally large region inside the magnetic resonance measurement chamber. Typical antenna structures for such whole body coils are the known cage structure and the known saddle coil structure.

In the magnetic resonance examinations of specific sub-regions of a subject or a patient to be examined, arrangements known as "local coils" are increasingly used as antennas to acquire the magnetic resonance signals. In the examination, these local coils are arranged relatively close to the body surface directly at the examination subject of interest (for example a specific organ or body part). In contrast to the whole body coil, such local coils have the advantage of being able to be located closer to the regions of interest. The noise component caused by the electrical losses within the examination subject is thereby reduced so that the signal-to-noise ratio (SNR) of a local coil is in principle better than that of a farther-removed antenna. A single antenna element (for example in the form of a single conductor loop with a pre-amplifier) is, however, only able to generate an effective image within a defined spatial expanse that lies on the order of the diameter of the conductor loop. Therefore—and to minimize the measurement time with parallel imaging—most local coils are designed as multi-channel coils with a number of individual antenna elements, for example many individual conductor loops arranged in parallel like a matrix or overlapping one another, each normally connected to its own pre-amplifier. Presently local coils with up to 32 channels or individual antenna elements are already normally used. Local coils with up to 128 channels are in planning or in trial use. Such local coils can be mechanically designed in an arbitrary manner, for example as relatively flexible, flat antenna arrangements that are placed on, under or at the examination subject, or as stable cylindrical constructions for use as head coils or the like, for example.

In order to be able to ensure and check the functionality of a local coil even in the field (for example on location in the operating (installation) site), it is meaningful to create standardized and largely automated measurement methods that are automatically executed. With such a field quality check (generally also called a "QA check" (QA: quality assurance)), an operator of the magnetic resonance system can determine himself or herself (i.e. without the use of a service technician) whether a local coil is functioning properly or whether a defect exists at a single one of or multiple antenna elements. If such a QA check does not run successfully, the local coil is sent back to the manufacturer, who simultaneously receives information about the possible cause of error and the error location in the local coil as the result of the quality check. Presently such a field quality check is conducted with the tested coil being installed in a fixed, defined position in the scanner unit of the magnetic resonance system together with an imaging phantom. The field quality check is based on the generation of magnetic resonance images of the phantom that are automatically evaluated and tested for deviations from predefined thresholds. This method has several disadvantages.

Such quality tests last multiple minutes because complete magnetic resonance images must be generated. Furthermore, the use of a phantom is necessary for the testing, and this phantom must be positioned precisely according to a predetermined measurement specification. Errors in the positioning can lead to the situation of a local coil being incorrectly detected as defective. This generates high costs in returned goods traffic. Finally, such a quality test must always be conducted as an independent measurement that cannot simply be handled in a standard patient operation.

SUMMARY OF THE INVENTION

An object of the present invention is to provide a simplified but nevertheless more certain method for field quality check and a testing device suitable for this purpose.

In the method according to the invention for field quality testing of a magnetic resonance antenna arrangement of a magnetic resonance system composed of multiple antenna elements, a test signal is fed into the respective antenna elements by a transmission antenna. The test signal, or a noise signal that occurs with no input to the antenna elements, is determined at the receiver unit for each of at least some of the individual antenna elements (advantageously for all antenna elements) of the magnetic resonance antenna arrangement. As mentioned above, an individual antenna element typically is formed by a conductor loop and pre-amplifier (arranged optimally close to the conductor loop) as well as corresponding conductors and connections in order to tap the signal at the pre-amplifier and supply the pre-amplifier with the necessary power. The receiver unit can in particular also be a component of a multi-channel receiver, wherein the individual antenna elements, or their pre-amplifiers, are respectively connected with specific input channels of this multi-channel receiver. The measured noise signals and/or test signals are then analyzed with regard to specific characteristic data. For example, characteristic values from the noise signals and/or test signals are extracted, or the noise and/or test signals are directly evaluated, so that the characteristic data are generated therefrom. A quality state of the magnetic resonance antenna arrangement is then determined based on this information. Such a quality state can be a simple good/bad decision that indicates only whether the magnetic resonance antenna arrangement is in order or not. Alternatively, it may be a detailed, quantitative and/or qualitative statement, for example whether and by how much a specific characteristic value (index) deviates from a reference characteristic value (in particular a normal characteristic value) or the like.

The invention thus departs entirely from the previous methodology of field testing methods, in which magnetic resonance images have always been acquired and evaluated, and instead uses direct testing of the radio-frequency properties of the individual antenna elements or of the entire acquisition change from the actual conductor loop to the receiver in the implementation of a non-imaging (imaging-free) measurement procedure. The insight to use a direct testing is based on the further insight that the errors that typically occur in such magnetic resonance antenna arrangements are for the most part based on measurable radio-frequency causes, namely:

i. An individual antenna element does not deliver any signal at all. Possible reasons for this are, for example, that the fuse normally provided for each antenna element has blown, [or] that the pre-amplifier belonging to the antenna element or a cable is defective.

ii. An antenna element supplies too much noise. A possible reason for this is, for example, a pre-amplifier that has a high noise proportion or exhibits a reduced amplification (gain).

iii. An antenna element delivers too low a signal. For example, this can be due to the fact that the pre-amplifier has a reduced amplification.

iv. The coupling between two antenna elements has significantly changed. For example, this can be caused by a mechanical defect in the coil, in particular a defect at the pre-amplifier input.

All of these defects, that appear in the form of a large number of different phenomena in a quality check based on generation of phantom magnetic resonance images, can now be directly determined with the method according to the invention. This means that it is possible with the method according to the invention to collect more information about the error type, which allows targeted work in the defect analysis and repair of the magnetic resonance antenna arrangement. Nevertheless, no special test design with a phantom is required for the method according to the invention, and depending on the particular embodiment of the method the method can possibly even be conducted immediately before an actual magnetic resonance measurement, i.e. with an examination subject located in the magnetic resonance measurement chamber.

A testing device according to the invention for field quality testing according to this method requires a measurement signal interface in order to measure a test signal fed into the respective antenna elements by a transmission antenna and/or a noise signal for each of at least some of the individual antenna elements at a respective receiver unit. Furthermore, it requires an analysis unit in order to analyze the noise signals and/or test signals with regard to more specific characteristic data, as well as an evaluation unit in order to determine a quality state of the magnetic resonance antenna arrangement based on a quality state. Furthermore, it requires an output interface for signaling the quality state to an operator. This signaling can be a simple warning signal, for example, when the magnetic resonance antenna arrangement is faulty, but it can also be a more detailed output of quality state information, for example via an operator terminal or the like.

Such a testing device can be installed in any magnetic resonance systems that has a typical scanner unit with a magnetic resonance measurement chamber and a whole-body antenna in order to emit a radio-frequency signal into the magnetic resonance measurement chamber, as well as a control device to control the scanner unit and a magnetic resonance antenna arrangement with downstream magnetic resonance signal receiver units to receiver magnetic resonance signals. Conventional magnetic resonance systems can therefore also be expanded into magnetic resonance systems according to the invention by retrofitting with a testing device according to the invention.

The testing device can also be realized at least to a large part in the form of software. For example, the analysis unit and the evaluation unit can be realized in the form of software modules on a processor (for example a central processor) of the control device of the magnetic resonance system. The measurement signal interface and the output interface can likewise be realized at least in part in the form of software. The measurement signal interface can also be fashioned purely as software insofar as only digital values are accepted from another component that is realized on the same processor or a processor connected thereto. This means that the measurement signal interface is then merely fashioned in software to accept data from another software module. A realization in the form of software is normally more cost-effective and better suited for retrofitting of existing magnetic resonance systems.

In principle, such a quality testing method according to the invention can be used in any magnetic resonance antenna arrangement, for example also for testing a whole body coil formed of multiple antenna elements. This method is most advantageously used, however, for magnetic resonance antenna arrangements composed of multiple local coils or with one local coil, wherein the local coils or coil is/are arranged inside the magnetic resonance measurement chamber of the magnetic resonance system during the quality test.

A low noise signal typically arises in the antenna element, in particular in the pre-amplifier of the antenna element that outputs a noise signal at its output even without an input noise. This signal is normally already sufficient for an analysis, as is explained in further detail in the following.

Alternatively or additionally, a special test signal emitted for the testing can be used. In the simplest case a test signal can be directly emitted with the whole-body antenna of the magnetic resonance system. However, the test signal is preferably emitted with a special test transmission antenna. For example, this can be positioned inside the patient tunnel before the test measurement, or it can be permanently installed in the scanner unit.

The testing device preferably has not just one test transmission antenna but at least two transmission antennas, which are fashioned and arranged in the magnetic resonance measurement chamber such that they emit differently polarized test signals, so a transmission path with a transmission length greater than zero always exists between each transmission antenna and local coil to be tested.

The testing device itself advantageously has at least one test signal interface in order to indirectly or directly control the emission of a precisely defined test signal by a transmission antenna either via the whole-body antenna of the scanner unit or via the provided test transmission antennas. As used herein "indirect control" means that only a command is passed provided to a unit that actually controls the corresponding transmission antenna in order to prompt the emission of the test signal. This is particularly suited for emission of test signals with a whole body coil, since this typically ensues via a control unit of the magnetic resonance system that is provided for this purpose for normal operation. A corresponding command can then be supplied to this antenna control unit via the test signal interface of the testing device.

The noise signals and/or test signals for the individual antenna elements are advantageously individually determined in an analog/digital converter of a magnetic resonance signal receiver unit of the magnetic resonance system. These magnetic resonance signal receiver units are the same units that are also present anyway within the magnetic resonance system for further processing (in particular demodulation) of the magnetic resonance signals. For this purpose the measurement signal interface for reception of the noise signals and/or test signals of an antenna element must merely be connected with an associated analog/digital converter of the corresponding magnetic resonance signal receiver unit.

As explained above, the magnetic resonance signal receiver unit can be a module of a multi-channel receiver. Currently, multi-channel receivers with multiple individual receiver units or acquisition channels that respectively include an analog/digital converter are typically used anyway in order to convert the analog signal coming from the antenna element into a digital signal, then to decode it and evaluate it further.

The branching of the signal on the digital side of the analog/digital converter has the advantage that the additional analysis of the signals in the analysis unit can also be implemented on a purely digital level. This reduces the costs for the analysis unit. Separate receivers can naturally also be used (insofar as this is desired in a specific design) that, for example, divide or branch a signal portion of the signal transmitted to the normal magnetic resonance signal receiver unit, but this represents additional costs for the separate receivers.

A particularly easy way to obtain a quality status of the magnetic resonance antenna arrangement on the basis of the characteristic data determined in the analysis is a simple comparison of the characteristic data with defined reference data which, for example, correspond to the characteristic data given a properly functioning magnetic resonance antenna arrangement. For this purpose the evaluation unit can be fashioned as a comparator that, for example, uses previously established thresholds that have been stored in a memory as reference data. The evaluation unit then checks whether the determined characteristic data lie below or above the established thresholds in order to decide whether the quality is still acceptable or not.

The reference data for the individual antenna elements can also be established depending on the orientation (i.e. position and/or alignment) of the respective antenna element in the magnetic resonance system and/or relative to the transmission antenna that emits the test signal. The received signal depends on the position of the respective, receiving antenna element relative to the transmission antenna that emits the test signal. For example, if an antenna element in multi-element arrangement lies very close to the transmission antenna, a higher power is received than by a farther remote antenna element in the arrangement. The polarization direction of the test signal, and thus the alignment of the antenna element in space, can likewise play a role. All of this can be taken into account in the reference data.

If the test signal is emitted by the whole-body antenna of the magnetic resonance system, the position of the magnetic resonance antenna arrangement is relative insensitive. Particularly in this case, or given use of a test transmission antenna permanently installed in the scanner unit, for example, it is sufficient for a position at which the local coil to be tested is placed for a test to be marked on the patient table. This is significantly less complicated (costly) than a precise positioning of the antenna arrangement together with a phantom, as has been necessary in conventional methods.

In a preferred variant, one or even multiple test transmission antennas (possibly with different polarization directions) are integrated directly into the local coil at a specific location. With such a magnetic resonance antenna arrangement according to the invention, the method according to the invention can be implemented particularly simply with an integrated test transmission antenna which can emit a defined test signal to test the magnetic resonance antenna arrangement.

The magnetic resonance antenna arrangement is likewise preferably equipped with a data storage capability. Reference data usable in the method according to the invention for the concrete magnetic resonance antenna arrangement are stored in a data storage unit, the reference data being determined and/or provided by a manufacturer of the magnetic resonance antenna arrangement for the properly functioning antenna arrangement, for example. For this purpose the magnetic resonance antenna arrangement and the testing device must still have additional interfaces so that the reference values can be read out from the testing device for the testing. Such an individual storage of the data directly in the local coil additionally has the advantage that it is not necessary to design the tolerances of the boundary values so broadly that all local coils from a series can be correctly tested; rather, the individually measured values for the individual local coils can actually be stored in the memory.

A large number of different values can be determined as characteristic data.

For example, if a noise signal is used as a characteristic value for each channel, a noise power characteristic value (for example an average noise power density or another characteristic value representing the noise power) can be determined for each channel. This can then be compared with a simple, pre-established threshold in order to determine whether the noise power in the acquisition chain of the respective antenna element is too high, and therefore whether a defect could be present.

Relative characteristic numbers between the individual antenna elements also can be stored and obtained as characteristic data. Such relative characteristic numbers can advantageously be amplitude differences and/or phase differences present between the individual antenna elements. Variations within a series of antenna arrangements can be better accounted for in this way.

With an appropriate test signal, for example, in the simplest case the amplification or the gain of the acquisition chain can be determined by the test signal being sent and the reception coils being simultaneously switched to receive. For example, a mono-frequency carrier in the bandwidth of the expected magnetic resonance signal can be used as a test signal. A spectrally broad noise source—for example with a "hot/cold" cross-over (in particular of the "Y-factor" type)—can likewise be used. A relatively weak power between 1 pW and 1 W is sufficient for such test signals. Here a comparison with a simple threshold is also possible. For example, if no signal is measured, this is a sign that a channel has possibly totally failed, possibly because the safety fuse has blown or the pre-amplifier has failed.

In a preferred version of this exemplary embodiment, the reception amplifier can be controlled by increasing the test signal with increasing input level. This means that the power of the test signal is increased in steps continuously during the measurement. The characteristic data then can be based on a dependency of the test signal output power (measured at the respective antenna element) on the test signal input power. For example, for this purpose a diagram or chart can be generated in which the input power is plotted against the output power. The non-linearity of the reception amplifier and the decompression of the acquisition chain can thus be established. Such a characteristic number can also be used as a quality index for testing the receiver properties.

In the method described in the preceding, the properties of the entire acquisition chain (consisting of conductor loop, pre-amplifier, wiring and receiver input) are primarily taken into account. It is frequently the case that the signal outputs of the antenna elements are additionally connected with the magnetic resonance signal receiver units via a switching device (or switching matrix). Which antenna elements are connected with magnetic resonance signal receiver units during a specific measurement can be established via such a switching device. This is particularly utilized when the magnetic resonance antenna device has more channels than the number of acquisition channels in the magnetic resonance system. In this case the properties of the switching device also enter into the signal acquisition chain.

This switching device can also be advantageously used in the testing. For example, multiple measurements of noise signals and/or test signals of the same antenna element can be conducted during a test, and the switching device is thus switched over between at least two measurements so that one signal output of the antenna element is connected with different magnetic resonance signal receiver units. For this purpose the testing device preferably has a crossover interface in order to switch (configure) the switching device in a defined manner during a quality test. For example, errors can be more precisely localized when a coil channel suspected as defective is switched to a different receiver device by the switching device. This redundancy check ensures that the defect is not present at the receiver device, itself but rather in components proceeding the switching device, i.e. either in the wiring to the antenna side or at the appertaining antenna element itself.

In a preferred exemplary embodiment, a noise correlation matrix is generated from the noise signals. Such a noise correlation matrix is a pair-by-pair cross-correlation between all single channels of a magnetic resonance antenna arrangement. Information about the coupling of the individual antenna elements among one another is thereby obtained. Such a noise correlation matrix can be considered as a fingerprint of a specific local coil or of a specific coil type. Changes in the noise correlation matrix are an indicator of variations of the electrical properties of the coil, for example a decoupling of adjacent elements or an altered pre-amplifier noise. A noise correlation matrix is particularly suited for evaluation in the form of characteristics since variations in the noise correlation matrix are easily identified using thresholds as errors. A complete reference noise correlation matrix is advantageously used for this purpose. A difference matrix can then advantageously be generated from the measured noise correlation matrix and the reference matrix. Whether significant variations exist that could indicate errors in the antenna arrangement is then immediately conspicuous in the difference matrix.

Most of the measurements cited above can be conducted in less than 0.1 s. It is thereby possible to read out the individual antenna elements in parallel via the individual receiver units insofar as sufficient receiver units are available. A cross-switching may possibly ensue so that the antenna elements are readout in succession or in groups, but this does not significantly increase the measurement time, because these measurement times required for the quality testing are comparable to the previous measurement times. A significantly shorter measurement time is required than with conventional methods, even for a somewhat more complicated measurement with stepped or continuous increase of a test signal. A measurement time of less than 0.2 s is thus necessary for such a (somewhat more comprehensive) measurement, in contrast to which the previous tests entailed a time cost of 0.5 min to 5 min.

BRIEF DESCRIPTION OF THE DRAWINGS

FIG. 7 is a difference matrix between the noise correlation matrix according to FIG. 5 and the reference noise correlation matrix according to FIG. 6.

DESCRIPTION OF THE PREFERRED EMBODIMENTS

Figure 1:
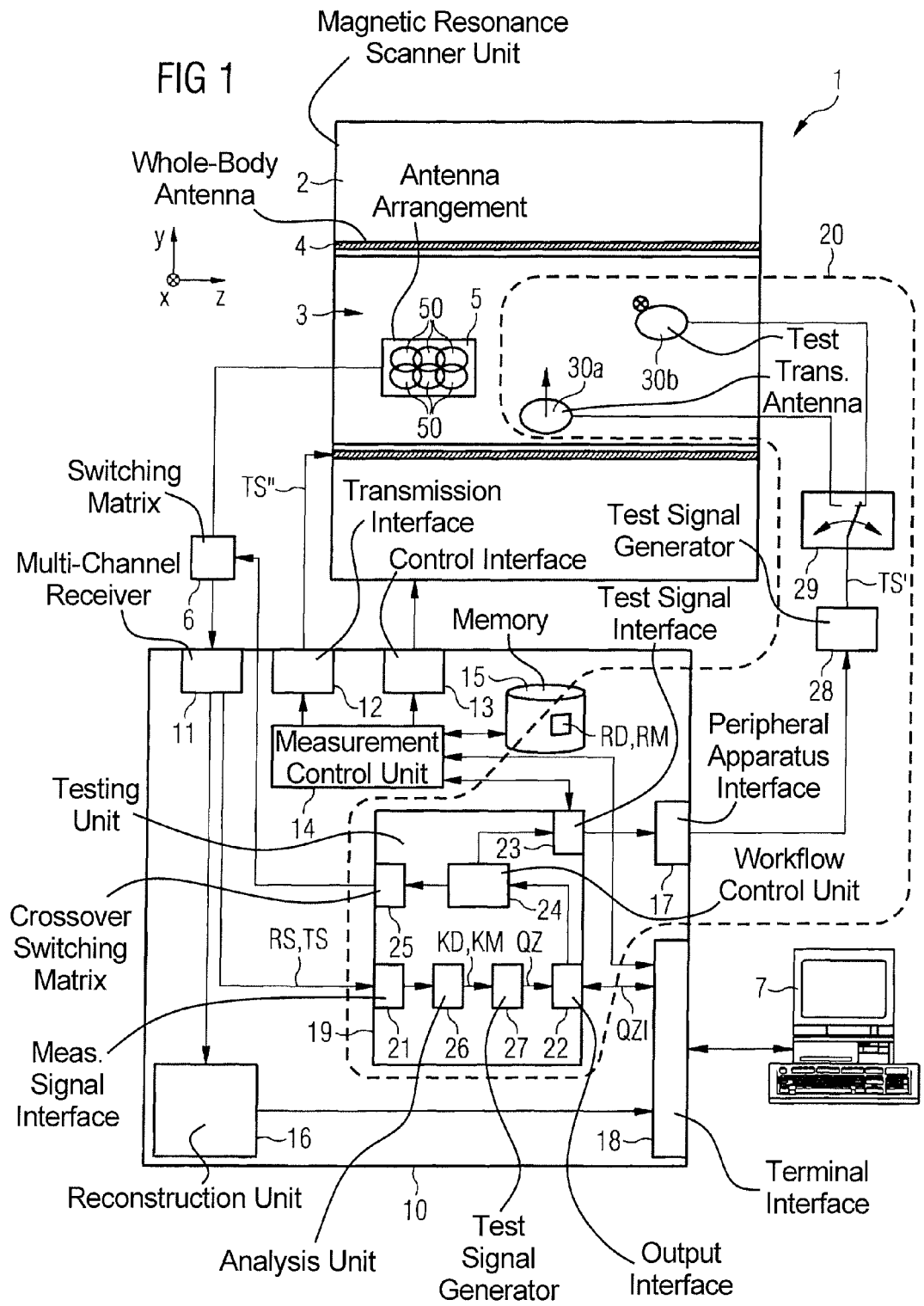
FIG. 1 is a schematic representation of an exemplary embodiment of a magnetic resonance system according to the invention.

A magnetic resonance system 1 according to the invention is shown in a rough schematic illustration in FIG. 1.

The system includes the actual magnetic resonance scanner unit 2 in which an examination subject or a patient or test subject is placed on a patient bed (not shown) in a magnetic resonance measurement chamber or patient tunnel 3 during an examination. There is a number of components in this magnetic resonance scanner unit 2. These components include a basic magnetic field generation unit that generates an optimally homogenous basic magnetic field inside the patient tunnel 3. Furthermore, the magnetic resonance scanner unit 2 contains gradient coils with which a magnetic field gradient can be applied in a defined manner within the patient tunnel 3, as well as a whole-body antenna 4 with which radio-frequency fields can be emitted in the patient tunnel 3.

In addition to the aforementioned components (of which only the whole-body antenna 4 is schematically shown in FIG. 1 for clarity), the magnetic resonance scanner unit 2 typically has a number of additional components, for example a shim system in order to improve the homogeneity of the basic magnetic field, a monitoring system for general monitoring tasks, etc.

The scanner unit 2 is controlled by a control unit 10, of which likewise only the components that are essential for the explanation of the invention are shown in FIG. 1. In principle, such magnetic resonance systems 1 and the associated control devices 10 are known to those skilled in the art and therefore need not be explained in detail.

A large part of the control device 10 shown in FIG. 1 is realized in the form of software modules in one or more processors within a housing of the control device 10. In principle, however, such a control device can be formed of multiple components or modules arranged in a spatially distributed manner and networked among one another in a suitable manner.

The control device 10 here has various interfaces, for example a terminal interface 18 with which the control device 10 is connected with a terminal 7 for the operator. This terminal 7 typically embodies a user interface—for example a keyboard and a screen and possibly a pointer device (a mouse or the like)—so that a graphical user interface is also made available to the user.

Additional significant interfaces are a radio-frequency transmission interface 12 (which here represents the complete radio-frequency transmission branch of the magnetic resonance system 1) and a multi-channel receiver 11 having multiple magnetic resonance signal receiver units (not individually shown in FIG. 1).

For example, the whole-body coil 4 in the scanner unit 2 is activated via the radio-frequency transmission interface 12. A magnetic resonance antenna arrangement 5 (designated as a local coil 5 for short going forward in the following) that has multiple antenna elements 50 is connected to the multi-channel receiver 11. These antenna elements 50 are coupled via a switching matrix 6 with the magnetic resonance signal receiver units (also designated as acquisition channels in the following) of the multi-channel receiver 11, wherein which antenna element 50 is connected with which of the acquisition channels is respectively established via the switching matrix 6.

Figure 2:
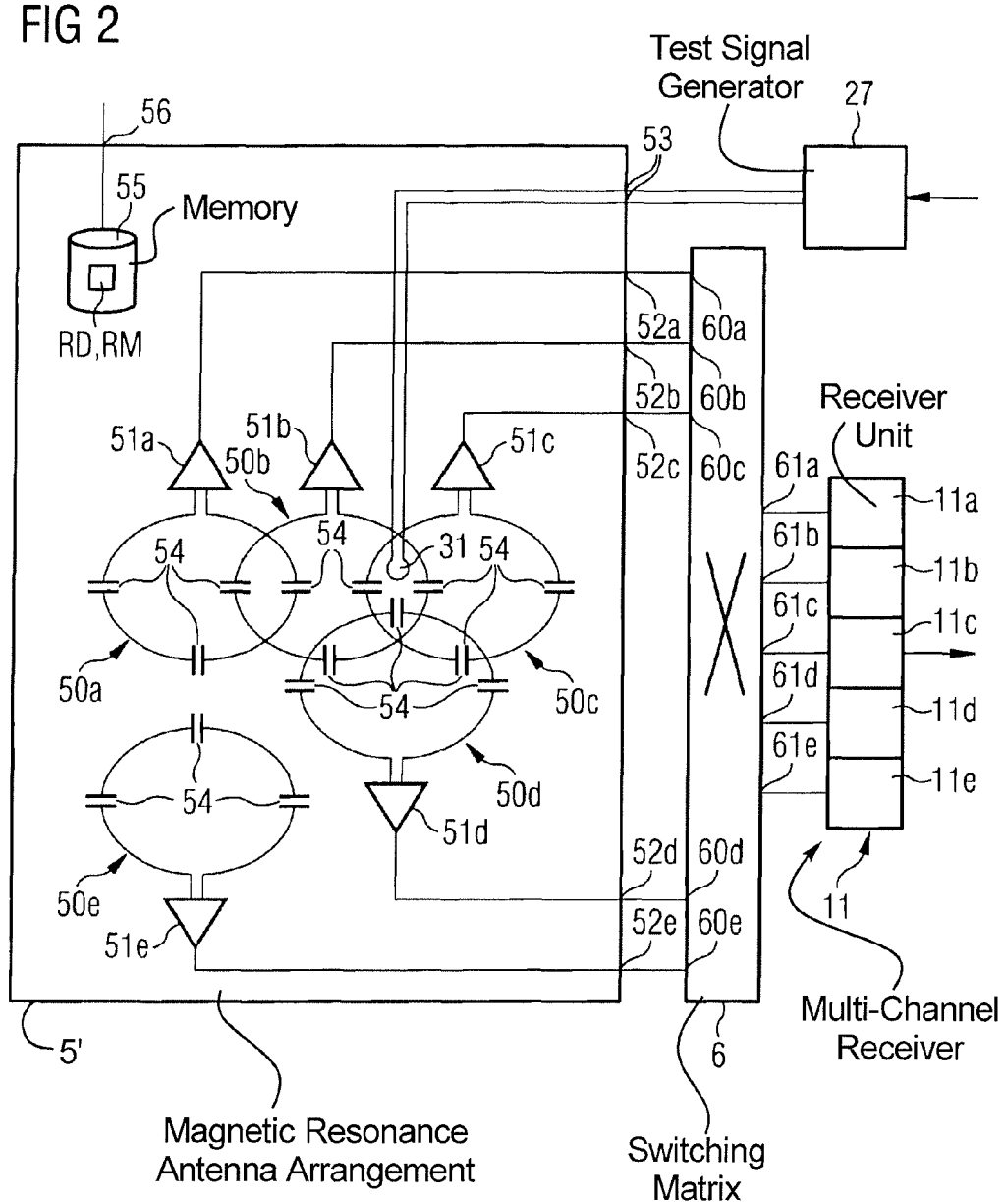
FIG. 2 is a more detailed, schematic representation of an exemplary embodiment of a magnetic resonance antenna arrangement according to the invention, with an integrated test transmission coil.

This is shown again in more detail in FIG. 2. Here a magnetic resonance antenna arrangement 5' with in total five individual antenna elements 50a, 50b, 50c, 50d, 50e is shown. These are each formed by a simple conductor loop with three capacitors 54 and respective pre-amplifiers 51a, 51b, 51c, 51d, 51e arranged at a tap point. The antenna elements 50a, 50b, 50c, 50d, 50e can in principle be arbitrarily arranged depending on the desired reception characteristic of the local coil 5', for example overlapping like the elements 50a, 50b, 50c, 50d or also not overlapping with other antenna elements like the antenna element 50e. The design shown in FIG. 2 is merely one exemplary design which indicates a few of the many possibilities.

The outputs of the pre-amplifiers 51a, 51b, 51c, 51d, 51e of the antenna elements 50a, 50b, 50c, 50d, 50e are respectively connected via conductors with terminals [connectors] 52a, 52b, 52c, 52d, 52e of the magnetic resonance antenna arrangement 5'. The signal outputs 52a, 52b, 52c, 52d, 52e can respectively be connected with corresponding inputs 60a, 60b, 60c, 60d, 60e of the switching matrix 6 which are switched to specific signal inputs 61a, 61b, 61c, 61d, 61e depending on the switching state of the inputs 60a, 60b, 60c, 60d, 60e. The signal outputs 61a, 61b, 61c, 61d, 61e of the switching matrix 6 are in turn connected with the magnetic resonance receiver units 11a, 11b, 11c, 11d, 11e which here (as is typical) are integrated into a multi-channel receiver 11 as individual acquisition channels, but in principle they can be fashioned as separately designed receiver units. These magnetic resonance signal receiver units 11a, 11b, 11c, 11d, 11e are designed in a typical manner, for example with a digital/analog converter as well as with various demodulators in order to filter the desired information out of the magnetic resonance signals.

As is additionally shown in FIG. 1, the magnetic resonance signals of the individual antenna elements that are received by the multi-channel receiver 11 or the individual acquisition channels or sub-units are supplied to an image reconstruction unit 16 which generates magnetic resonance images in the typical manner from the raw data acquired in this manner.

As an additional interface, the control device 10 has a control interface 13 for the other components of the scanner unit 2 via which the aforementioned gradient coils etc. are controlled, for example. The control interface 13 can be formed by multiple interfaces that, for simplicity are shown merged into one interface block. The control interface 13 and the radio-frequency transmission interface 12 are controlled by a measurement control unit 14 that provides for emission of the gradient pulse and radio-frequency pulse sequences necessary for a specific magnetic resonance measurement according to precisely predetermined measurement protocols that, for example, are stored in a memory 15 and/or can be provided or modified by a user via the terminal 7.

According to the invention, the control device 10 also has a testing unit 19 which is part of a testing device 20 of the magnetic resonance system according to the invention. This testing unit 19 can also be realized in the form of software modules, for example. One such module is a measurement signal interface 21. This measurement signal interface 21 polls respective noise signals generated by the antenna elements 50 and/or test signals TS acquired by these in digital form at the magnetic resonance signal receiver unit 11. The signals are thereby accepted at the output of a digital/analog converter of the individual magnetic resonance signals receiver units for the various antenna elements 50.

An additional component of the testing unit 19 is an analysis unit 26 that analyzes the respective test signal TS or noise signal RS so that specific characteristic data KD, KM are extracted from these signals. These characteristic data KD, KM are passed to an evaluation unit 27 (for example a simple comparator) that compares the characteristic data with reference data RD, RM that, for example, also can be stored in the memory 15.

The quality state QZ that is thereby determined can then be passed to an output interface 22 which relays corresponding quality state information QZI to the terminal interface 18 in order to then output these to the user at the terminal, for example in the form of a simple notice that the magnetic resonance antenna arrangement is defective, or also with additional information of the effect of this defect.

Here the testing device 19 additionally has a testing workflow control unit 24 that causes specific test signals to be emitted in order to conduct specific tests. For this purpose the testing workflow control unit 24 can address the measurement control unit 14 via a test signal interface 23 so that a desired test signal TS" is emitted by the whole-body coil 4. This test signal interface 23 is moreover connected with a peripheral apparatus interface 17 of the control device 10. Such a peripheral apparatus interface can be an input/output interface at which various external apparatuses (for example an EKG to monitor the patient etc.) can be connected. In the exemplary embodiment shown in FIG. 1, a test signal generator 28 which generates a test signal TS' with a power between 0.1 pW and 1 W is connected here as an additional part of the testing device 20. This test signal TS' is switched via a transmission antenna crossover switch 29 either to a first test transmission antenna 30a or a second test transmission antenna 30b, wherein the two test transmission antennas 30a, 30b are arranged at various points within the magnetic resonance measurement chamber 3 and are aligned such that they emit linearly polarized signals with different polarization (the first test transmission antenna 30a operates with a linear polarization in the y-direction and the second test transmission antenna 30b operates with a linear polarization in the x-direction). The arrangement of the test transmission antennas 30a, 30b within the magnetic resonance measurement chamber is such that the patient does not lie between the test transmission antennas 30a, 30b and the magnetic resonance antenna arrangement 5 to be tested. These test transmission antennas 30a, 30b can be permanently arranged within the magnetic resonance measurement chamber 3. Like the transmission antenna crossover switch 29, they belong to the testing device 20. The transmission antenna crossover switch 29 can likewise be controlled by the test workflow control unit 24 via the peripheral apparatus interface 17 and the test signal interface 23.

The test workflow control unit 24 can send a signal to the switching matrix 6 via a crossover switching matrix 25 in order to connect targeted, specific antenna elements 50 with specific input channels or magnetic resonance signal receiver sub-units of the magnetic resonance signal receiver unit 11. In principle, however, it is also possible for this crossover switching matrix 25 to send a corresponding signal to a control unit (for example the measurement control unit 14) provided for this purpose which otherwise controls the switching matrix 6 during the normal magnetic resonance measurements.

In a preferred variant, a test transmission antenna 31 (called a test coil 31 in the following) is already directly installed in the magnetic resonance antenna arrangement 5'. This is shown in FIG. 2. The test coil 31 is connected with terminals 53 which are in turn connected with a test signal generator 27 in order to provide a desired test signal to the test coil 31. This test signal generator 27 can be controlled again via a test signal interface 23 (for example) if the test unit 11 shown in FIG. 1 as well as via the peripheral apparatus interface 17.

The installation of such a test coil 31 in the local coil 5' has the advantage that the spatial arrangement (and therefore the coupling between the test coil 31 and the individual antenna elements 50a, 50b, 50c, 50d, 50e is independent of the position of the local coil 5' within the magnetic resonance measurement chamber, and thus a very straightforward and simple field quality test is possible even in running operation between two magnetic resonance measurements, without any special measures having to be taken.

In the following, exemplary embodiments for preferred variants of the method are explained.

In a preferred first variant, a simple noise level measurement ensues.

Figure 3:
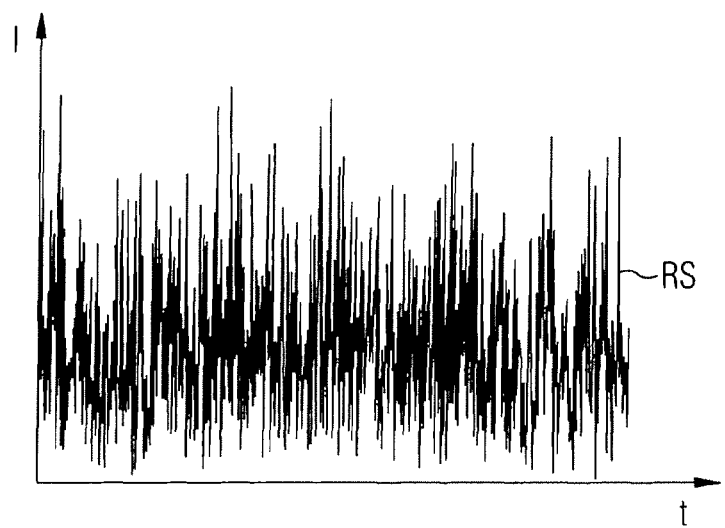
FIG. 3 is a diagram with an example of a noise signal.

FIG. 3 shows an example of a noise signal RS. Here the intensity I of the noise signal RS is plotted over time t (respectively in arbitrary units). As explained above, such a noise is already created in the antenna elements, for example in the pre-amplifiers of the antenna elements themselves. The noise properties of the entire acquisition chain can therefore be calculated directly via the statistical evaluation of the scattering of the signals at the analog/digital converter of the receiver. In the event that the average noise power density is too high, an error exists in the acquisition chain. Since the entire acquisition chain is considered, such an error cannot in fact be unambiguously associated with the actual conductor loop; nevertheless, this is one case that would generate distinct quality losses in the imaging, such that the appertaining antenna element can be considered as impaired or defective.

The noise signal RS shown in FIG. 3 is actually a noise voltage that is tapped via a resistor. The noise power P can be calculated from this according to the following equation:

$$P \sim \frac{U^2}{R} \qquad (1)$$

U is thereby the noise voltage and R is the equivalent resistance via which the voltage is tapped. The noise power P calculated in such a way as an index KD and respectively averaged over an arbitrarily predetermined time segment (possibly continuous with the time) can be compared with a predefined reference value RW or threshold. Such a measurement can ensue in less than 0.1 s since sufficient measurement values of the analog/digital converter are provided in this time period.

In a second preferred variant, the gain of the entire acquisition chain is determined. For example, for this a signal in the form of an (advantageously monofrequent) carrier in the magnetic resonance band is sent with a weak power between 1 pW and 1 W with the whole-body coil, or preferably with a test transmission antenna, and the antenna elements are thereby simultaneously switched to receive. If no signal at all is measured at an antenna element or, respectively, the corresponding analog/digital converter of the magnetic resonance receiver unit, the appertaining channel has failed. By comparison with a predefined reference value it can also be established here whether the signal is possibly too low. As explained above, the reference signal must thereby be established dependent on the position of the respective antenna element relative to the respective transmission antenna.

However, in particular with the use of a magnetic resonance signal antenna arrangement 5' as in FIG. 2 with installed test transmission antenna, this is not a problem. In this case specific reference values for the individual transmission antenna elements 50a, 50b, 50c, 50d, 50e must simply be stored that are invariably set by the mechanical cohesion of the individual antenna elements with the test transmission antenna. A specific positioning of the magnetic resonance antenna arrangement relative to the test transmission antenna is then no longer necessary; rather, it must only be ensured that, given use of a flexible magnetic resonance antenna arrangement, this arrangement is not deformed in an undefined manner so that it does not unnecessarily strongly affect a noise correlation.

In a third variant, the amplitude and/or phase differences are also drawn upon as relative indices between the individual antenna elements as an alternative or in addition to the level of the transmission signal. Here as well the deviations of the amplitude and/or phase differences from previously measured reference values stored for the respective antenna elements can be determined to determine the quality state. For example, a value of 0.5 dB lends itself to use as a reference value for the amplitude differences, and a value of 10° lends itself to use as a phase difference reference value. Given deviations greater than the indicated reference values, this is an indication of a possible problem in the acquisition chain.

Figure 4:
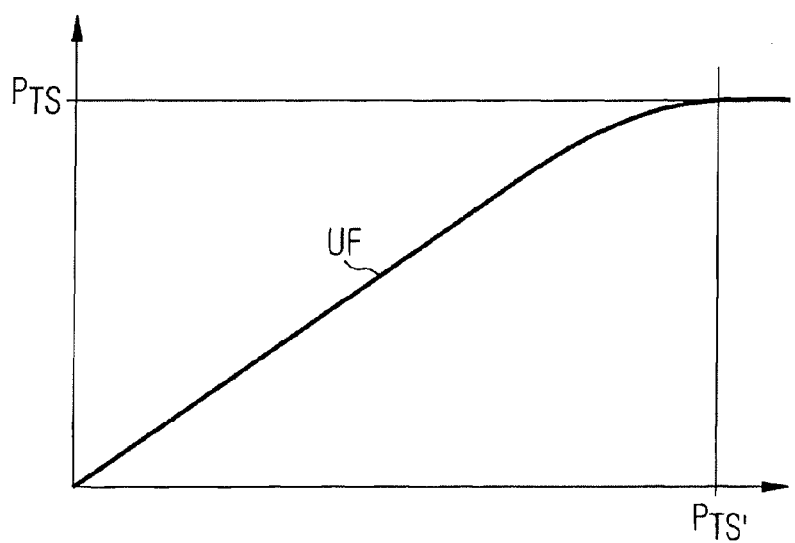
FIG. 4 is a diagram showing an example of the output power at an antenna element depending on the power of a radiated test signal.

Furthermore, a variant is preferably be used in which the transmission signal is increased step-by-step, for example. In this way the pre-amplifier in the antenna elements can be controlled with rising input level by increasing the transmission signal. FIG. 4 shows a diagram in which the power $P_{TS}$ of the test signal TS determined at the analog/digital converter of the respective magnetic resonance receiver unit is plotted over the power $P_{TS'}$ of the actual test signal TS' emitted by the test transmission antenna. Characteristic data of the transfer function UF that is formed in this way are its slope and non-linearity, in particular the values at which the transfer function UF kinks in the upper range and the output power $P_{TS}$ no longer rises with increasing input power $P_{TS'}$. These are measures that indicate the compression of the acquisition chain and therefore can be used as quality indices for testing the individual antenna elements.

Figure 5:
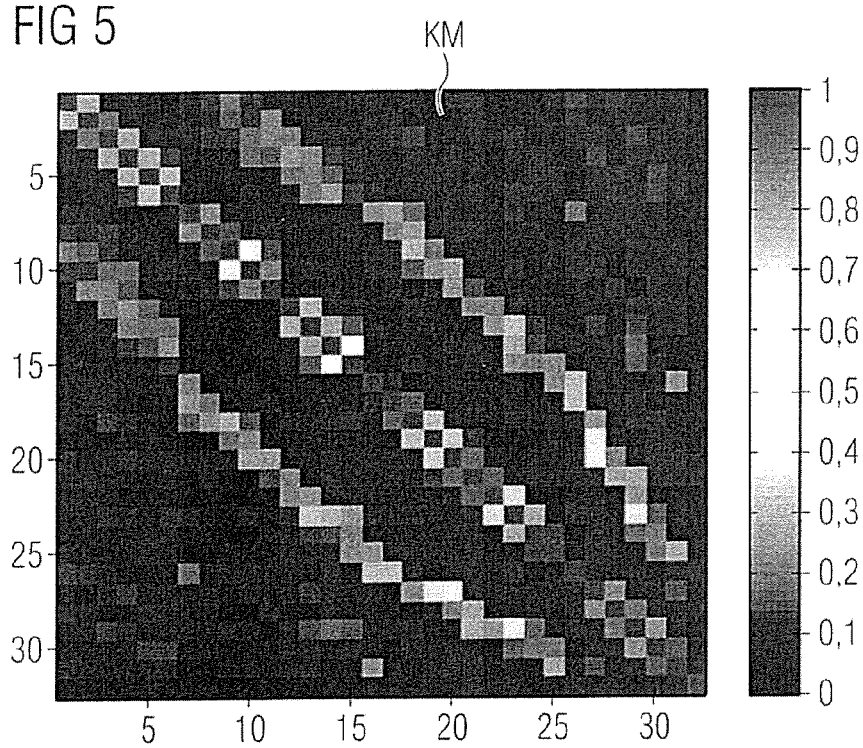
FIG. 5 is an example of a noise correlation matrix for a magnetic resonance antenna arrangement with 32 antenna elements.

In a preferred variant, a noise correlation matrix KM is additionally or alternatively determined and evaluated as characteristic data for a magnetic resonance antenna arrangement to be tested. This is in the form of a cross-correlation between the noise signals detected by the individual antenna elements. FIG. 5 shows such a noise correlation matrix KM for a magnetic resonance-antenna arrangement with 32 individual elements. Such a noise correlation matrix KM is naturally always symmetrical in structure. The cross-correlation values are respectively shown in units from 0 to 1 as they appear at the bar diagram to the right of the matrix. Such cross-correlation diagrams are typically presented in color. Such a noise correlation matrix KM can be considered as a fingerprint of a specific coil type. Any change in the noise correlation matrix KM is an indicator of the variation of the electrical properties of the coil, for example a change of the pre-amplifier noise or a decoupling of adjacent elements. Given a repeated measurement of such a noise correlation matrix KM with the same coil it arises that the reproducibility is very good and that the noise correlation matrix contains sufficient information in order to be able to clearly recognize a change. The similarities of the noise correlation matrices of two coils of the same design and of the same series are also sufficiently high in order to be able derive quality-relevant data for testing the function.

Figure 6:
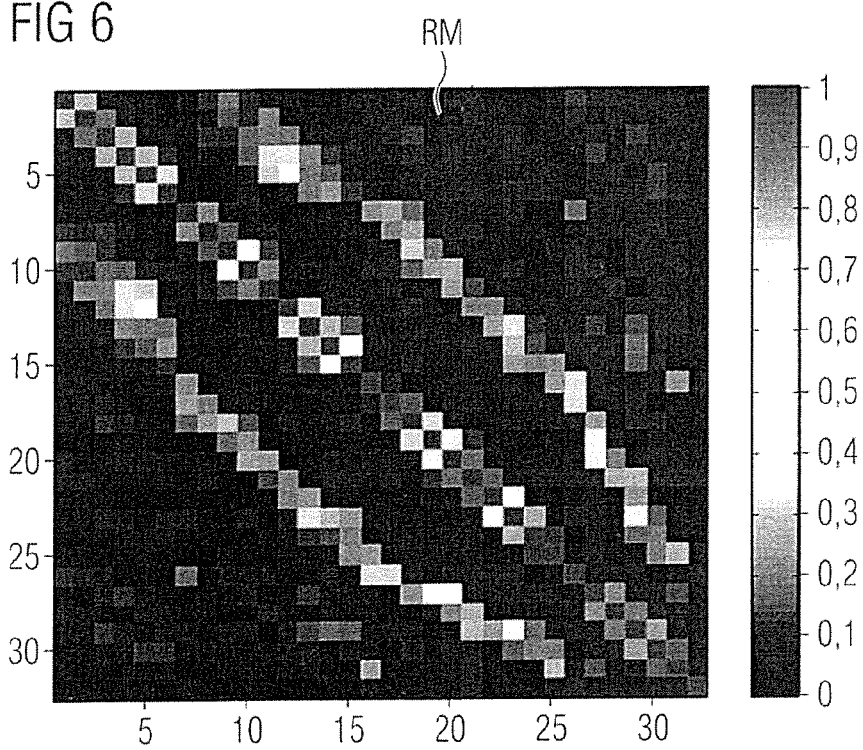
FIG. 6 is a reference noise correlation matrix for the magnetic resonance antenna arrangement which shows the noise correlation matrix according to FIG. 5.

For a simple evaluation of the quality state it is therefore sufficient to provide a corresponding reference noise correlation matrix RM as it is shown in FIG. 6, for example. Given a test a difference matrix DM can then be formed between the measured noise correlation matrix KM and the reference noise correlation matrix RM. Such a difference matrix DM is shown in FIG. 7. Deviations of the noise correlation matrix KM from the reference matrix RM immediately stand out with the use of such a difference matrix DM, such that defects (here in the range of the channels 11, 12 or, respectively, 4, 5) can be immediately detected. A measurement of such a noise correlation matrix can ensue in less than 0.1 s.

As already explained above in connection with FIG. 1, the reference values or, respectively, a reference noise correlation matrix RM can also be stored in a memory 15 of the control device 10 of the magnetic resonance system 1. These reference data are always dependent on the type of magnetic resonance antenna arrangement that is used (which should be checked immediately). Depending on the type, the reference values are possibly even specific to the precise magnetic resonance antenna arrangement to be tested and must be predetermined at the factory for every single magnetic resonance antenna arrangement.

Therefore, such reference data RD, RM are preferably stored in a memory within the magnetic resonance coil arrangement. For example, the local coil 5' can be provided with a memory 55 in the form of an EEPROM in which the reference data are stored. Such a memory 55 is shown in the preferred magnetic resonance antenna arrangement 5' in FIG. 2. Via an output 56 these data can also be polled via the peripheral apparatus interface 17 of the control device 10 and be used within the quality test.

Overall, the use of direct radio-frequency measurements (i.e. not imaging measurements) employed according to the invention for quality testing of magnetic resonance antenna arrangements has significant advantages. The signal transmission and noise measurements as well as the correlation measurements that are required for this are possible for the system in an automated manner takes distinctly less time than the testing with imaging methods today. The entire evaluation also requires significantly less time. More information can thereby be collected in a distinctly shorter time and be used for quality monitoring. Since no phantoms are necessary, the measurement expenditure is additionally significantly simplified and errors can no longer occur due to incorrect positioning of the phantom. Depending on the design of the method, the measurement is possible in part even during the patient operation without temporally affecting the total measurement time.

The designs described above are merely exemplary embodiments, and the basic principle can be varied in wide ranges by those skilled in the art within the scope of the invention. In particular, it is explicitly noted that the variants of the method, the testing device and in particular the magnetic resonance antenna arrangement that are described above can also be used in arbitrary combinations with one another. For completeness it is also noted that the use of the indefinite article "a" or "an" does not preclude that the appertaining features can also be present multiple times. The term "unit" also does not preclude the inclusion of multiple components that can possibly also be spatially distributed.

I claim as my invention:

1. A method for field quality testing of a magnetic resonance antenna arrangement of a magnetic resonance system, said magnetic resonance antenna arrangement comprising a plurality of antenna elements, said method comprising the steps of:
   from at least one of said antenna elements of said resonance magnetic resonance system, producing an output noise signal resulting from noise occurring with no signal radiated by at least one of said antenna elements; and
   in a processor, analyzing said noise signal by extracting characteristic data therefrom and, dependent on a deviation of the extracted characteristic data from predetermined characteristic data, identifying a quality state of said magnetic resonance antenna arrangement.

2. A method as claimed in claim 1 comprising employing a magnetic resonance diagnostic signal receiver unit of said magnetic resonance system as said receiver unit, and determining said signals in said receiver unit in an analog-to-digital converter of said magnetic resonance diagnostic signal receiver unit, forming said receiver unit.

3. A method as claimed in claim 1 comprising comparing said characteristic data with defined reference data to identify said quality state of said magnetic resonance antenna arrangement.

4. A method as claimed in claim 3 comprising establishing said reference data depending in respective positions of the respective antenna elements in said magnetic resonance system or on respective positions of the respective antenna elements relative to the transmission antenna.

5. A method as claimed in claim 1 comprising employing a characteristic noise power value as said characteristic data.

6. A method as claimed in claim 1 comprising employing relative characteristic values between individual ones of said antenna elements as said characteristic data.

7. A method as claimed in claim 6 comprising employing relative characteristic values between individual ones of said antenna elements selected from the group consisting of amplitude differences and phase differences.

8. A method as claimed in claim 1 comprising connecting respective outputs of said antenna elements to respective magnetic resonance signal receiver units via a crossover switching device, and implementing multiple measurements of said received signals for each antenna element during a test, and between two of said measurements, switching said crossover switching device to cause a signal output of an antenna element to be connected with a different one of said magnetic resonance signal receiver units.

9. A method as claimed in claim 1 comprising employing a noise correlation matrix as said characteristic data.

10. A method as claimed in claim 1 comprising operating at least one of said plurality of antenna elements as a transmission antenna and, from said transmission antenna, feeding a test signal to at least one other antenna element among said plurality of antenna elements, and producing an output signal, resulting from said test signal, at said at least one of said antenna elements that received said test signal; and
    in said processor, also analyzing said output signal by extracting characteristic test signal data therefrom and, dependent on a deviation of the extracted characteristic test signal data from predetermined characteristic test signal data, identifying said quality state of said magnetic resonance antenna arrangement.

11. A method as claimed in claim 10 wherein said magnetic resonance antenna arrangement comprises at least one local coil, and feeding said test signal into said at least one local coil while said at least one local coil is located within a magnetic resonance data acquisition chamber of the magnetic resonance system.

12. A method as claimed in claim 10 comprising during transmission of said test signal, increasing a power of said test signal.

13. A method as claimed in claim 12 comprising employing characteristic data based on a dependency of said power of said test signal in said received signal to a power of said test signal in said test signal from said transmission antenna.

14. A method as claimed in claim 10 comprising emitting said test signal with a test signal transmission antenna that is different from a transmission antenna used for diagnostic purposes in said magnetic resonance system.

15. A testing device for field quality testing of a magnetic resonance antenna arrangement of a magnetic resonance system, said magnetic resonance antenna arrangement comprising a plurality of antenna elements, said testing device comprising:
    a transmission antenna that feeds a test signal into the respective antenna elements of said magnetic resonance antenna arrangement, each of said antenna elements producing a received signal selected from the group consisting of a received signal resulting from said test signal and a noise signal occurring with no signal fed to the respective antenna elements;
    a receiver unit that determines the respective received signals for each of at least some of said antenna elements, the test signal or the noise signal; and
    a processor that analyzes the signals determined by said receiver unit dependent on predetermined characteristic data to identify a quality state of said magnetic resonance antenna arrangement, and that emits an output representing said quality state.

16. A testing device as claimed in claim 15 comprising providing a test signal interface that controls emission of a defined test signal by said transmission antenna.

17. A testing device as claimed in claim 16 comprising wherein said receiver unit is a magnetic resonance diagnostic signal receiver unit of said magnetic resonance system, comprising an analog-to-digital converter connected to said test signal interface.

18. A testing device as claimed in claim 15 wherein said test transmission antenna is an antenna other than an antenna used to obtain diagnostic data in said magnetic resonance system.

19. A testing device as claimed in claim 18 wherein said test transmission antenna comprises two test transmission radiators that respectively emit feed signals with different polarizations.

20. A magnetic resonance system comprising:
    a magnetic resonance antenna arrangement comprising a plurality of antenna elements; and
    a field quality testing device comprising a transmission antenna that feeds a test signal into the respective antenna elements of said magnetic resonance antenna arrangement, each of said antenna elements producing a received signal selected from the group consisting of a received signal resulting from said test signal and a noise signal occurring with no signal fed to the respective antenna elements, a receiver unit that determines the respective received signals for each of at least some of said antenna elements, the test signal or the noise signal, and a processor that analyzes the signals determined by said receiver unit dependent on predetermined characteristic data to identify a quality state of said magnetic resonance antenna arrangement, and that emits an output representing said quality state.

21. A magnetic resonance antenna device comprising:
    a magnetic resonance antenna arrangement comprising a plurality of antenna elements; and
    a transmission antenna that feeds a test signal into the respective antenna elements of said magnetic resonance antenna arrangement, each of said antenna elements to produce a received signal resulting from said test signal; and
    a device output connected to said antenna elements configured for connection to a receiver unit to supply the received signals thereto to allow identification of a quality state of said magnetic resonance antenna arrangement dependent on the received signals.

22. A method for field quality testing of a magnetic resonance antenna arrangement of a magnetic resonance system, said magnetic resonance antenna arrangement comprising a plurality of antenna elements, said method comprising the steps of:
    operating at least one antenna element among said plurality of antenna elements as a transmission antenna and, from said transmission antenna, radiating a test signal;
    with at least one other antenna element among said plurality of antenna elements, receiving said test signal and emitting an output signal resulting from said test signal; and
    supplying said output signal to a processor and, in said processor, analyzing said output signal by extracting characteristic test signal data therefrom and, dependent on a deviation of the extracted characteristic test signal data from predetermined characteristic test signal data, identifying a quality state of said magnetic resonance antenna arrangement.

23. A magnetic resonance system comprising:
    a magnetic resonance antenna arrangement comprising a plurality of antenna elements;
    a test signal source connected to at least one antenna element among said plurality of antenna elements, said test signal source operating said at least one antenna element connected thereto as a transmission antenna by, from said transmission antenna, radiating said test signal;

at least one other antenna element among said plurality of antenna elements receiving said test signal and producing an output signal resulting from said test signal; and a processor supplied with said output signal, said processor being configured to analyze said output signal by extracting characteristic test signal data therefrom and, dependent on a deviation of the extracted characteristic test signal data from predetermined characteristic test signal data, identifying a quality state of said magnetic resonance antenna arrangement, and said processor further being configured to emit an indication of said quality state at an output of said processor.

* * * * *